United States Patent
Ho et al.

(10) Patent No.: US 12,000,455 B2
(45) Date of Patent: Jun. 4, 2024

(54) SYSTEMS AND METHODS FOR REDUCING VIBRATION OF APPARATUSES

(71) Applicant: TAIWAN SEMICONDUCTOR MANUFACTURING COMPANY, LTD., Hsinchu (TW)

(72) Inventors: Yi Chen Ho, Taichung (TW); Chih Ping Liao, Hsinchu (TW); Chien Ting Lin, Hsinchu (TW); Jie-Ying Yang, Yunlin County (TW); Wei-Ming Wang, Hsinchu (TW); Ker-Hsun Liao, Hsinchu (TW); Chi-Hsun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/691,805

(22) Filed: Mar. 10, 2022

(65) Prior Publication Data

US 2023/0287952 A1    Sep. 14, 2023

(51) Int. Cl.
*F16F 7/10*       (2006.01)
*B23Q 11/00*    (2006.01)

(52) U.S. Cl.
CPC .......... *F16F 7/10* (2013.01); *F16F 2222/08* (2013.01)

(58) Field of Classification Search
CPC .......... F16F 7/10; F16F 15/02; F16F 2222/08; B23Q 11/00; B23Q 17/12; H01L 21/50
See application file for complete search history.

(56) References Cited

U.S. PATENT DOCUMENTS

| | | | | |
|---|---|---|---|---|
| 5,984,233 A | * | 11/1999 | Snyder, Jr. | F16F 7/108 244/119 |
| 6,296,093 B1 | * | 10/2001 | Norris | G05D 19/02 409/141 |
| 7,065,428 B2 | * | 6/2006 | Baran | B23Q 11/0032 73/660 |
| 7,201,546 B2 | * | 4/2007 | Ichino | F16F 15/22 409/141 |
| 7,306,082 B2 | * | 12/2007 | Kwan | B23K 20/004 267/137 |
| 8,138,693 B2 | * | 3/2012 | Terada | G05D 19/02 318/702 |
| 8,360,697 B2 | * | 1/2013 | Hamann | F16F 7/10 409/141 |

(Continued)

FOREIGN PATENT DOCUMENTS

| | | | |
|---|---|---|---|
| JP | 2004134682 A | * | 4/2004 |
| JP | 2005030486 A | * | 2/2005 |

(Continued)

*Primary Examiner* — Thomas W Irvin
(74) *Attorney, Agent, or Firm* — STUDEBAKER & BRACKETT PC

(57) ABSTRACT

A method that includes measuring vibration levels in a semiconductor manufacturing apparatus, determining one or more sections of the semiconductor manufacturing apparatus that vibrate at levels greater than a predetermined vibration level, and reducing the vibration levels in the one or more sections to be at or within the predetermined vibration level by coupling one or more weights to an external surface of the semiconductor manufacturing apparatus in the one or more sections.

20 Claims, 7 Drawing Sheets

(56) References Cited

U.S. PATENT DOCUMENTS

| | | | |
|---|---|---|---|
| 8,985,935 B2* | 3/2015 | Tan | F16F 15/10 414/744.1 |
| 9,177,937 B2* | 11/2015 | Mochizuki | H01L 24/75 |
| 9,346,139 B2* | 5/2016 | Bleicher | B23Q 3/04 |
| 9,568,063 B2* | 2/2017 | Weiss | F16F 7/10 |
| 10,184,539 B2* | 1/2019 | Kraner | F16F 7/1011 |
| 10,808,790 B2* | 10/2020 | Kraner | F16F 7/1011 |
| 2002/0155731 A1 | 10/2002 | Suenaga et al. | |
| 2002/0179806 A1* | 12/2002 | Teng | F16F 7/1005 248/618 |
| 2003/0090645 A1 | 5/2003 | Kato | |
| 2004/0057031 A1 | 3/2004 | Hara | |
| 2004/0201148 A1* | 10/2004 | Kwan | F16F 1/3605 267/137 |
| 2007/0097340 A1* | 5/2007 | Yuan | F16F 7/1005 355/75 |
| 2007/0273074 A1* | 11/2007 | Mizuno | F16F 15/03 267/136 |
| 2008/0197550 A1* | 8/2008 | Heiland | F16F 15/02 267/136 |
| 2009/0039575 A1* | 2/2009 | Umemoto | F16F 15/02 267/75 |
| 2010/0060220 A1* | 3/2010 | Terada | H02P 25/034 318/460 |
| 2010/0247261 A1* | 9/2010 | Hamann | F16F 7/10 409/141 |
| 2011/0205507 A1 | 8/2011 | Kloesch et al. | |
| 2011/0259525 A1* | 10/2011 | Mochizuki | F16F 15/28 29/729 |
| 2012/0045723 A1* | 2/2012 | Nawata | G03F 7/709 248/550 |
| 2012/0298392 A1* | 11/2012 | Weiss | F16F 7/10 173/162.1 |
| 2013/0213169 A1* | 8/2013 | Tan | H01L 21/68707 294/213 |
| 2016/0091047 A1* | 3/2016 | Kramer | F16F 7/1011 267/140.14 |
| 2019/0234478 A1* | 8/2019 | Kraner | F16F 7/1011 |
| 2021/0080835 A1* | 3/2021 | Jacobs | F16F 13/002 |

FOREIGN PATENT DOCUMENTS

| | | |
|---|---|---|
| TW | 557504 B | 10/2003 |
| TW | 201020692 A | 6/2010 |

* cited by examiner

SYSTEMS AND METHODS FOR REDUCING VIBRATION OF APPARATUSES

BACKGROUND

As semiconductor chips are advancing to smaller nanometer size, the need for isolation of unwanted vibration frequency is more desirable in fabrication facility design and operation. Low frequency vibration may affect production tools and, thereby, lower production yield rate in semiconductor fabrication. challenges from both fabrication and design issues have resulted in the development of three-dimensional designs, such as a multi-gate field effect transistor (FET), including a fin FET (Fin FET) and a gate-all-around (GAA) FET.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
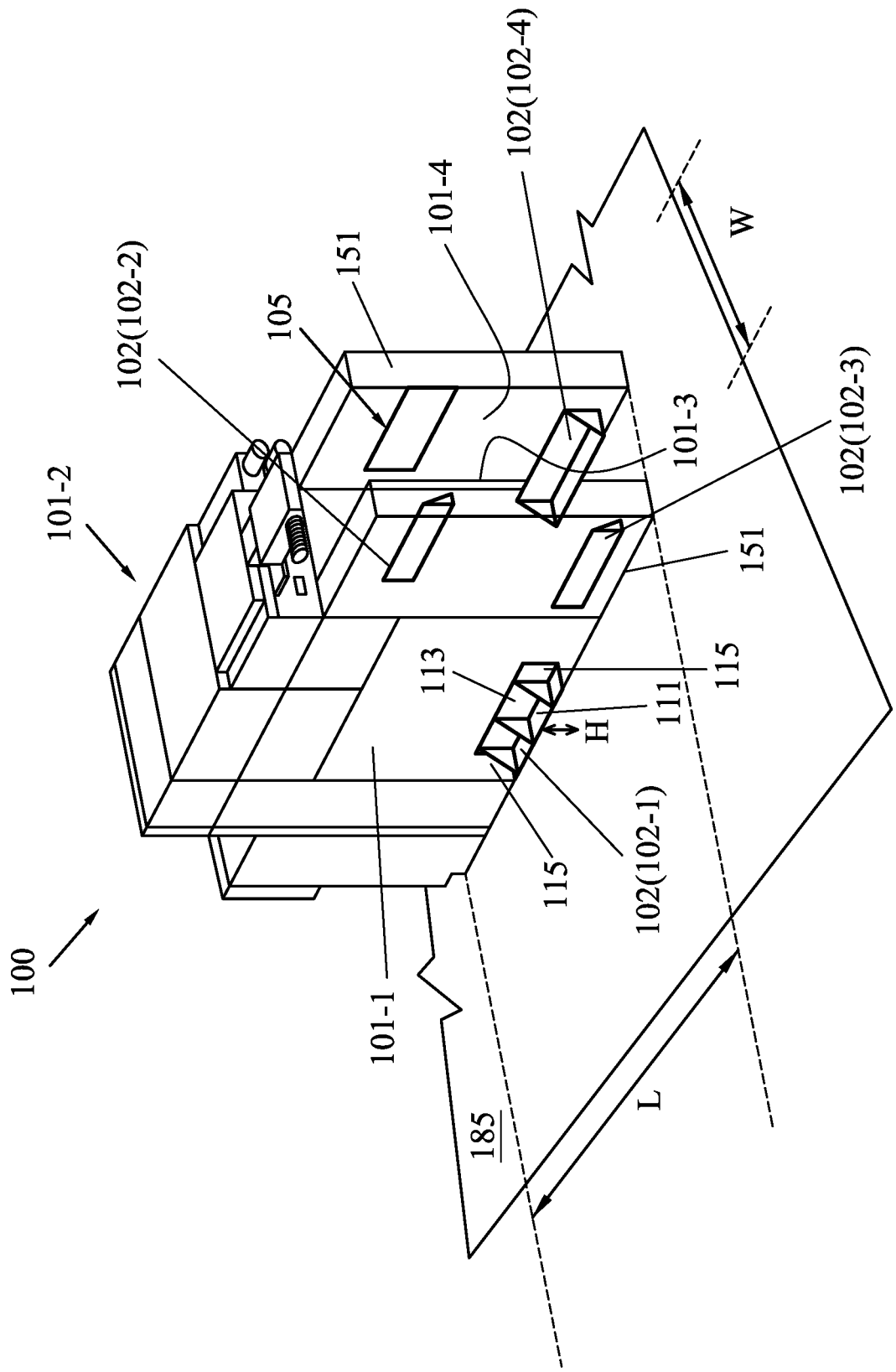
FIG. 1 illustrates a semiconductor manufacturing apparatus including multiple weights (or masses) attached thereto, according to embodiments of the disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

As the semiconductor industry has progressed into nanometer technology process nodes in pursuit of higher device density, higher performance, and lower costs, vibration control to mitigate vibrations affecting the semiconductor manufacturing apparatus has taken importance. Low frequency vibration may affect production tools such as lithograph tools, thin film deposition tools, furnace equipment, and, thereby, lowering production yield rate in semiconductor fabrication. Foot traffic due to personnel passing by the equipment or operating the equipment, oscillating pumps, compressors, chillers and AHUs (air handling units), or natural phenomenon like earthquakes, tornadoes, or hurricanes, produce low vibration frequencies transmitted though building and clean room floor structure. The vibrations affect the quality of the semiconductor device being manufactured. For instance, during a thin film deposition process, thin film particles are deposited not only on semiconductor substrates but also on a wafer boat that holds the wafers and on sidewalls of the chamber. When vibration/shaking of the equipment occurs, the thin film particles deposited on the wafer boat and the chamber sidewalls may fall onto the wafers, resulting in defects, such as, pits, bumps, line defects, and the like.

Embodiments of the disclosure are directed to semiconductor manufacturing facilities and similar high precision processing facilities and, more particularly to systems and methods for vibration reduction in semiconductor manufacturing apparatus and the like. According to embodiments of the disclosure, vibration reduction can be achieved by increasing the weight (or mass) of a semiconductor manufacturing apparatus (e.g., furnace equipment for thin film deposition, or other types of semiconductor manufacturing apparatus) by attaching (or coupling) weights (or masses) to the semiconductor manufacturing apparatus. Increasing the weight (or mass) of the equipment makes the equipment less susceptible to vibrations and reduces the defects in the semiconductor device being manufactured. The add-on weights (or masses) can be or include metal (e.g., iron) blocks, metal plates, metal bars, and the like. In some embodiments, the weights are attached to the semiconductor manufacturing apparatus using fasteners (screws, bolts, studs, pins, nails, anchors, rivets, hooks, magnets and the like). In some embodiments, the weights or masses are anchors to fix the equipment to the floor or gratings of a clean room. The weights are attached to the semiconductor manufacturing apparatus at any desired location, for example, on the sides of the equipment. In some embodiments, damping material, such a rubber pads, neoprene pads, and the like and arranged between the weights and the semiconductor manufacturing apparatus. The damping material better secures the weights to the semiconductor manufacturing apparatus and limits vibrations of the semiconductor manufacturing apparatus from passing to the weights, and thereby limits vibrating (rattling) of the weights.

For the purposes of discussion herein, "vibrations" refer to undesirable, unintentional vibrating of the semiconductor manufacturing apparatus that can cause errors in the manufacturing process.

In some embodiments, the weights are attached in a removable manner such that they can be easily removed (detached or disassembled) from the semiconductor manufacturing apparatus. For instance, the weights are attached using screws, hooks, or other easily removable fasteners so that the weights can be easily and relatively quickly removed. The weights can be removed entirely, or be replaced with heavier or lighter weights, as desired. It will be understood that the weights (or masses) that are added (attached) to the semiconductor manufacturing apparatus are not limited to metallic weights and to any specific shapes of weight. Weights (or masses) of any material and having any shape can be used provided that the weights reduce the vibrations to a desired level. It should also be noted that the weights are considered to removably attached when the weights can be removed from the equipment without requiring to destroy the fastener holding the weights or without causing damage to the weights and/or the equipment. So a weight that is screwed on and screwed off or that is attached using magnets is considered to be removably attached compared to a weight that is attached using rivets, since the rivets need to be cut (destroyed) in order to remove the weight.

In some embodiments, the weights (masses) are shaped and sized (or otherwise configured) such that the weights already attached to the semiconductor manufacturing apparatus need not be removed in order to increase the weight. For instance, the weights attached can include attachments parts (hooks, bars, etc.) to which additional weights can be attached. In other cases, the weights are shaped as plates (or similar shapes) or otherwise have surfaces on which additional weights can be placed (or stacked) to increase the overall weight of the semiconductor manufacturing apparatus. Similarly, the added weights can be removed to reduce the overall weight on the semiconductor manufacturing apparatus. Such addition and removal of weights also helps in adjusting the weight distribution on the semiconductor manufacturing apparatus with relative ease.

In some embodiments, the add-on weights (or masses) are attached to the semiconductor manufacturing apparatus such that the add-on weight is not in contact with a floor on which the semiconductor manufacturing apparatus rests. As a result, the entire weight of the add-on weight is added to the semiconductor manufacturing apparatus. In contrast, when the add-on weight contacts (rests) the floor, the weight on the semiconductor manufacturing apparatus is reduced. In some embodiments, the semiconductor manufacturing apparatus is placed on an anti-vibration platform that rests on the floor of the facility where the semiconductor manufacturing apparatus is located. It should be noted that, for the sake of explanation, the embodiments of the disclosure are discussed with reference to semiconductor manufacturing apparatus. However, embodiments are not limited to semiconductor manufacturing apparatuses, and embodiments of the disclosure can be applied to reduce vibrations in any device, tool or machinery, without departing from the sprit and scope of the disclosure.

FIG. 1 illustrates semiconductor manufacturing apparatus 100 including multiple weights (or masses) attached thereto, according to embodiments of the disclosure. As an example, FIG. 1 illustrates a furnace used in semiconductor device manufacturing. As illustrated, the multiple weights 102-1, 102-2, 102-3, and 102-4 (collectively, weights 102) are attached on opposite lateral walls of the semiconductor manufacturing apparatus 100. For instance, weights 102-1 and 102-2 are attached on the external surfaces of opposite lateral walls 101-1 and 101-2 and facing away from each other. Weights 102-3 and 102-4 are attached on the external surfaces of the opposite laterals walls 101-3 and 101-4 and facing each other. Alternatively, in some other embodiments, the weights 102-3 and 102-4 are attached to the lateral walls 101-1 and 101-2 and facing opposite each other, instead of the lateral walls 101-3 and 101-4. In yet other embodiments, in addition to weights 102-3 and 102-4 attached to the opposite lateral walls 101-3 and 101-4, extra weights are also attached to the opposite lateral walls 101-1 and 101-2. It should be noted that these extra weights are separate from the weights 102-1 and 102-2. It should be noted that the number of weights 102 is not limited in any regard. The number of weights 102 can be increased or decreased, depending on application and design, provided the weights used reduce the vibration in the semiconductor apparatus 100 to desirable levels.

The weights 102 are attached a certain vertical distance H (separation or gap) from the floor 185 surface on which the semiconductor manufacturing apparatus 100 rests (positioned). In some embodiments, the distance H is determined based on the location of the semiconductor substrates in the semiconductor apparatus 100. For instance, the distance H is such that the weights 102 are proximate the path taken by the semiconductor substrates when being transported through different stages of the semiconductor apparatus 100 and/or the location in the semiconductor apparatus 100 where the semiconductor substrates are stored before or after processing.

In some embodiments, the weights 102 are attached to the semiconductor manufacturing apparatus 100 using fasteners (screws, bolts, studs, pins, nails, anchors, rivets, hooks, magnets and the like). In some embodiments, the weights 102 are vibration-proof fasteners that are engineered to limit self-loosening due to vibration. The vibration-proof fasteners include hex nuts with nylon inserts, jam nuts, lock nuts, slotted hex nuts, tooth lock washers, lock washers, and spring washers.

The weights 102 are attached such that the weight distribution on the semiconductor manufacturing apparatus 100 is balanced. One way to balance the weight distribution is to position the weights 102 on a same location on the opposite lateral walls. In some embodiments, the weights on opposite lateral walls are attached exactly opposite each or are offset from each other within a desired margin (e.g., +/-1-10 cm). For instance, opposite weights 102-1 and 102-2 are attached on the corresponding opposite lateral walls 101-1 and 101-2 at a same height from the floor surface and at a same distance from the edges (ends) of the lateral walls 101-1 and 101-2. Similarly, opposite weights 102-3 and 102-4 are attached on the corresponding opposite lateral walls 101-3 and 101-4 at a same height from the floor surface and at a same distance from the edges (ends) of the lateral walls 101-3 and 101-4. Oppositely attached weights 102 also have the same weight value in so that the weight distribution is balanced. For instance, weight 102-1 and 102-2 both weigh 10 kgs to 100 kgs.

In some embodiments, the opposite weights 102-1 and 102-2 are attached such that a separation between the weights 102-1 and 102-2 is minimal and the weights 102-1 and 102-2 are attached symmetrically to achieve an improved balance in weight distribution. Thus, as an example, referring to FIG. 1, in order to keep the separation between the weights 102-1 and 102-2 minimal, the weights 102-1 and 102-2 are separated in the width direction W, as opposed to being positioned longitudinally (length wide direction L) separated from each other. However, in other embodiments, the length L may be shorted than the width W of the semiconductor manufacturing apparatus 100. In that case, in order to keep the separation between the weights 102-1 and 102-2 minimal, the weights 102-1 and 102-2 are separated in the length direction L. For similar reasons, the opposite weights 102-3 and 102-4 are separated from each other in the width W direction.

Certain steps or sub-processes in a semiconductor manufacturing process are more sensitive (or susceptible) to vibrations of the semiconductor manufacturing apparatus than the other steps of the semiconductor manufacturing process. In other words, it is desirable to mitigate vibrations during certain steps or sub-processes in a semiconductor manufacturing process compared to other steps in the semiconductor manufacturing process. For instance, in a thin film deposition process (e.g., physical vapor deposition (PVD), chemical vapor deposition (CVD), solution deposition, and atomic layer deposition (ALD)), vibrations at time of loading/unloading of the wafer boat to/from the chamber can cause thin film particles to fall from the wafer boat and the chamber sidewalls onto the semiconductor substrate. In this case, the weights would be attached to or proximate (e.g., within 1 cm to 10 cm) the section of the thin film deposition apparatus where the loading/unloading of the wafer boat occurs. Thus, referring to FIG. 1, the weights 102-1 and 102-2 are attached to the sections of the semiconductor manufacturing apparatus 100 where steps or sub-processes that is more susceptible to vibrations occur.

The weights are also attached to or proximate portions of the semiconductor manufacturing apparatus with which users of the semiconductor manufacturing apparatus interact. For instance, referring to FIG. 1, the semiconductor manufacturing apparatus 100 includes a graphical user interface (GUI) 105 located on the lateral wall 101-4 for controlling an operation of the semiconductor manufacturing apparatus 100. The area around the GUI 105 experiences higher foot traffic due to increased operator movement. The weight 102-4 functions to mitigate the vibrations due to the higher foot traffic.

In some embodiments, the weight on the semiconductor manufacturing apparatus can be increased by increasing the amount (value) of weights attached to the semiconductor manufacturing apparatus. In such embodiments, the weights attached to the semiconductor manufacturing apparatus are sized and shaped, or otherwise configured, such that additional weights can be stacked on them.

Figure 2:
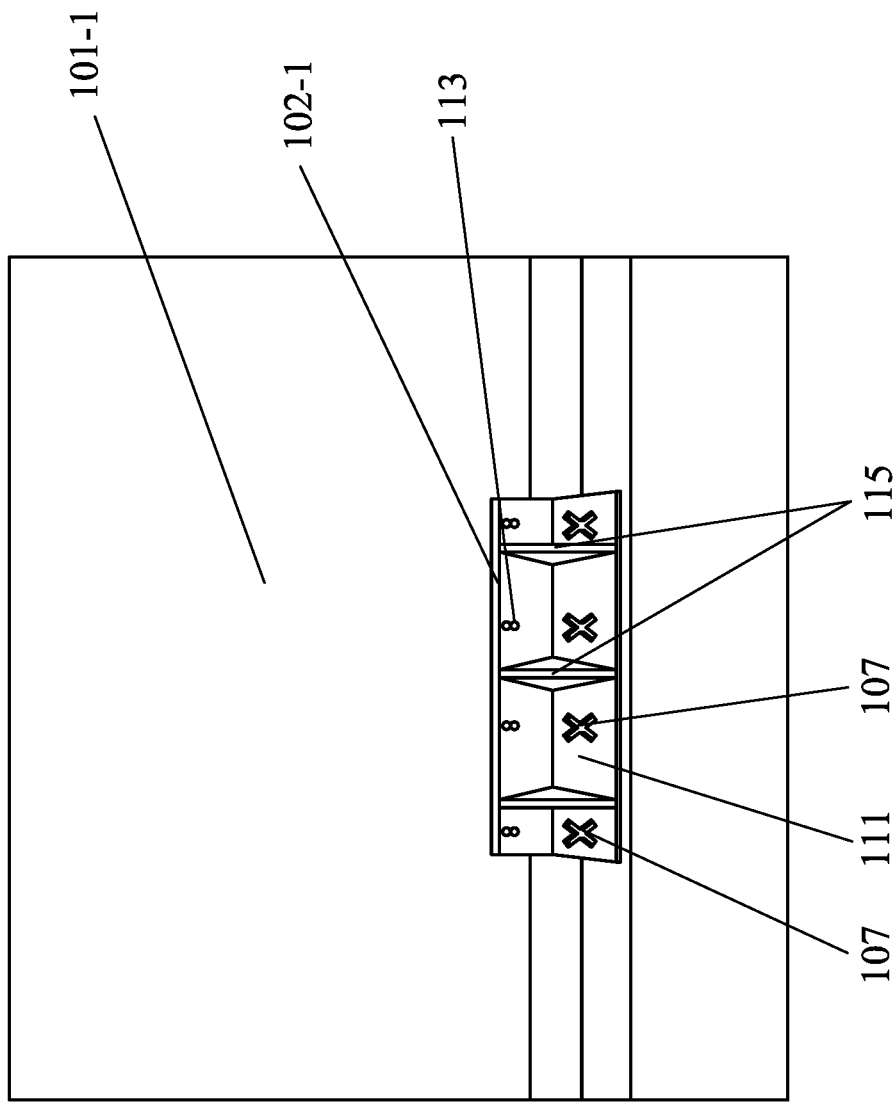
FIG. 2 illustrates a front view of a weight in FIG. 1, according to embodiments of the disclosure.

Referring to FIG. 2, with continued reference to FIG. 1, illustrated is a front view of weight 102-1 including a vertical portion 113 attached to the lateral wall 101-1 and a horizontal portion 111 extending outward from the vertical portion 113. The vertical portion 113 and the horizontal portion 111 are connected to each other via interconnecting portions 115. The weight 102-1 also includes attachment parts 107 for attaching additional weights to the weight 102-1. In FIG. 2, the attachment parts 107 include through holes in the shape of 'X'. An additional weight to be placed on the weight 102-1 will have a protrusion similarly in the shape of 'X' that is received in the attachment part 107 so that the additional weight is stably positioned on the weight 102-1. In order to increase the weight on the semiconductor manufacturing apparatus 100, additional weights can be placed on the horizontal portion 111. The weight 102-1 also includes multiple interconnecting portions 115 between adjacent attachment parts 107 to provide lateral support to the additional weights. In an example, the additional weights are shaped as plates that can be stacked on the horizontal portion 111. In another example, the additional weights are spherical balls that are placed on the horizontal portion 111.

One or more of the other weights 102-2, 102-3, and 102-4 are also shaped like weight 102-1. It will be understood that the shape and size of the weights 102 is merely an example and that the weights 102 can have any desired shape and size provided the weights 102 can support additional weights (functioning as a platform for the additional weights) for increasing the overall weight on the semiconductor manufacturing apparatus.

Thus, it is relatively easy to increase the weight on the semiconductor manufacturing apparatus 100 by increasing the additional weight on the weights 102 without needing to disassemble the existing weights and adding new heavier weights. Similarly, added weights can also be removed with relative ease.

Figures 3A, 3B:
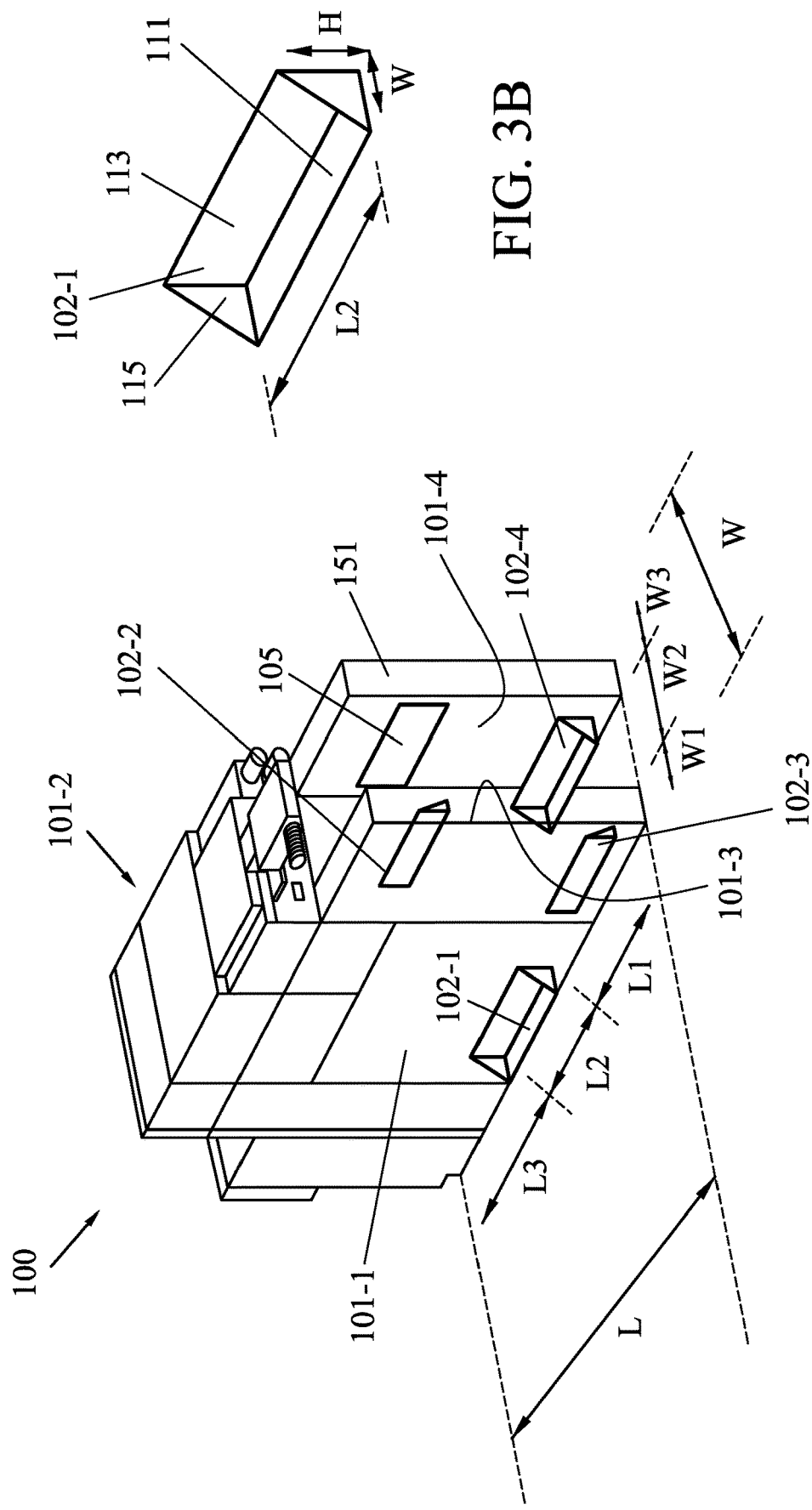
FIG. 3A illustrates an example arrangement of multiple weights on the semiconductor manufacturing apparatus in FIG. 1, according to embodiments of the disclosure.
FIG. 3B illustrates the dimensions of a weight in FIG. 1.

Referring to FIG. 3A, with continued reference to FIGS. 1 and 2, illustrated is an example arrangement of multiple weights 102 on the semiconductor manufacturing apparatus 100, according to embodiments of the disclosure. The semiconductor manufacturing apparatus 100 has a length L of around 460 cm and a width W of around 110 cm. The weight 102-1 has a length L2 of around 50 cm to 100 cm and is spaced from the lengthwise ends of the semiconductor manufacturing apparatus 100. The weight 102-1 is spaced from a proximal end by a distance L1 of around 180 cm to 230 cm and from a distal end by a distance L3 of around 180 cm to 230 cm. Referring to FIG. 3B, the vertical portion 113 of the weight 102-1 has a height H of around 10 cm to 50 cm and the horizontal portion 111 has a width W of around 10 cm to 30 cm.

As illustrated, the weight 102-1 is attached to a generally central portion of the semiconductor manufacturing apparatus 100 since semiconductor device processing steps (sub-processes) that are relatively more vibration sensitive occur at or proximate the central portion of the semiconductor manufacturing apparatus 100. If processing steps that are sensitive to vibration occur in other portions of the semiconductor manufacturing apparatus 100, the weight 102-1 would be located at or proximate those portions. Similarly, it will be understood that, if vibrations sensitive processes occur at more than one portion of the semiconductor manufacturing apparatus 100, weights are attached to some or all of the portions. However, it should be noted that the location of the weights is not limited to any particular location, and the weights can be placed at any desired location on the semiconductor manufacturing apparatus such that desired attenuation in the vibrations is obtained. One or more of the other weights 102-2, 102-3, and 102-4 are also shaped like weight 102-1. It will be understood that the shape and size of the weights 102 are merely an example and that the weights 102 can have any desired shape and size as required by application and design for reducing the vibrations to desirable levels.

In an embodiment, the weights 102 have weight values of around 30 kg to 80 kg. However, the weight value is not a limited thereto. In some other embodiments, the weight value is around 20 kg to 90 kg, or 10 kg to 100 kg. The lower limit of the weight value is determined based on the amount of vibration mitigation that is obtained when using the weights. A low weight value may not provide adequate vibration reduction for relatively heavy semiconductor manufacturing apparatus. Thus, the weights may have a minimum lower limit for weight value. The lower limits on the weight value are also determined based on the weight values of the additional weights that may be placed on the attached weights. Weights having a lower weight value may have a lower weight bearing capacity, and may be damaged with heavier additional weights are placed on the attached weights.

The upper limit of the weight value is determined on how stably the weight can be attached to the semiconductor manufacturing apparatus and the weight bearing capacity of the floor on which the semiconductor manufacturing apparatus is placed. It may be difficult to attach a heavy weight to the semiconductor manufacturing apparatus or there may be a risk that a heavy weight can dislodge (separate) from the semiconductor manufacturing apparatus and cause damage to the equipment and the floor.

The semiconductor manufacturing apparatus 100 includes extension portions 151 that extend longitudinally from the main body 171 of the semiconductor manufacturing apparatus 100. In the illustrated embodiment, and as mentioned above, one of the extension portion 151 (see, FIG. 1) includes the GUI 105; however, both extension portions can also include a GUI. The weights 102-3 and 102-4 are attached to the lateral walls 101-3 and 101-4, respectively, to reduce vibrations due to movement of equipment operators using the GUI 105. In an example, and as illustrated, the widths W1 and W3 of the extension portions 151 are around 20 cm, and the distance W2 between the lateral walls 101-3 and 101-4 is around 70 cm. In an embodiment, the weights 102-3 and 102-4 have a height H of around 10 cm to 50 cm, a width W of around 10 cm to 20 cm, and a length of around 100 cm to 120 cm. The shape and size of the weights 102-3 and 102-4 are chosen such that an operator can occupy the gap between the extension portions 151. In an embodiment, the weights 102-3 and 102-4 have weight values of around 30 kg to 80 kg. However, the weight value is not a limited thereto. In some other embodiments, the weight value is around 20 kg to 90 kg, or 10 kg to 100 kg. The lower limit of the weight value is determined based on the amount of vibration mitigation that is obtained when using the weights. A low weight value may not provide adequate vibration reduction for relatively heavy semiconductor manufacturing apparatus. Thus, the weights may have a minimum lower limit for weight value. The lower limits on the weight value are also determined based on the weight values of the additional weights that may be placed on the attached weights. Weights having a lower weight value may have a lower weight bearing capacity, and may be damaged with heavier additional weights are placed on the attached weights.

The upper limit of the weight value is determined on how stably the weight can be attached to the semiconductor manufacturing apparatus and the weight bearing capacity of the floor on which the semiconductor manufacturing apparatus is placed. It may be difficult to attached a heavy weight to the semiconductor manufacturing apparatus or there may be a risk that a heavy weight can dislodge (separate) from the semiconductor manufacturing apparatus and cause damage to the equipment and the floor.

The weights 102-3 and 102-4 are similar in shape as weight 102-1 illustrated in FIG. 3B, and the dimension length, width and height are similar to those of weight 102-1. In some embodiments, the weights 102-3 and 102-4 are omitted, for instance, when the extension portions 151 are absent. In still other embodiments, the weights 102-3 and 102-4 are omitted even in the presence of the extension portions 151. In other embodiments, the semiconductor manufacturing apparatus 100 includes on one extension portion 151 that includes the weight 102-3 (or 102-4).

Figure 4:
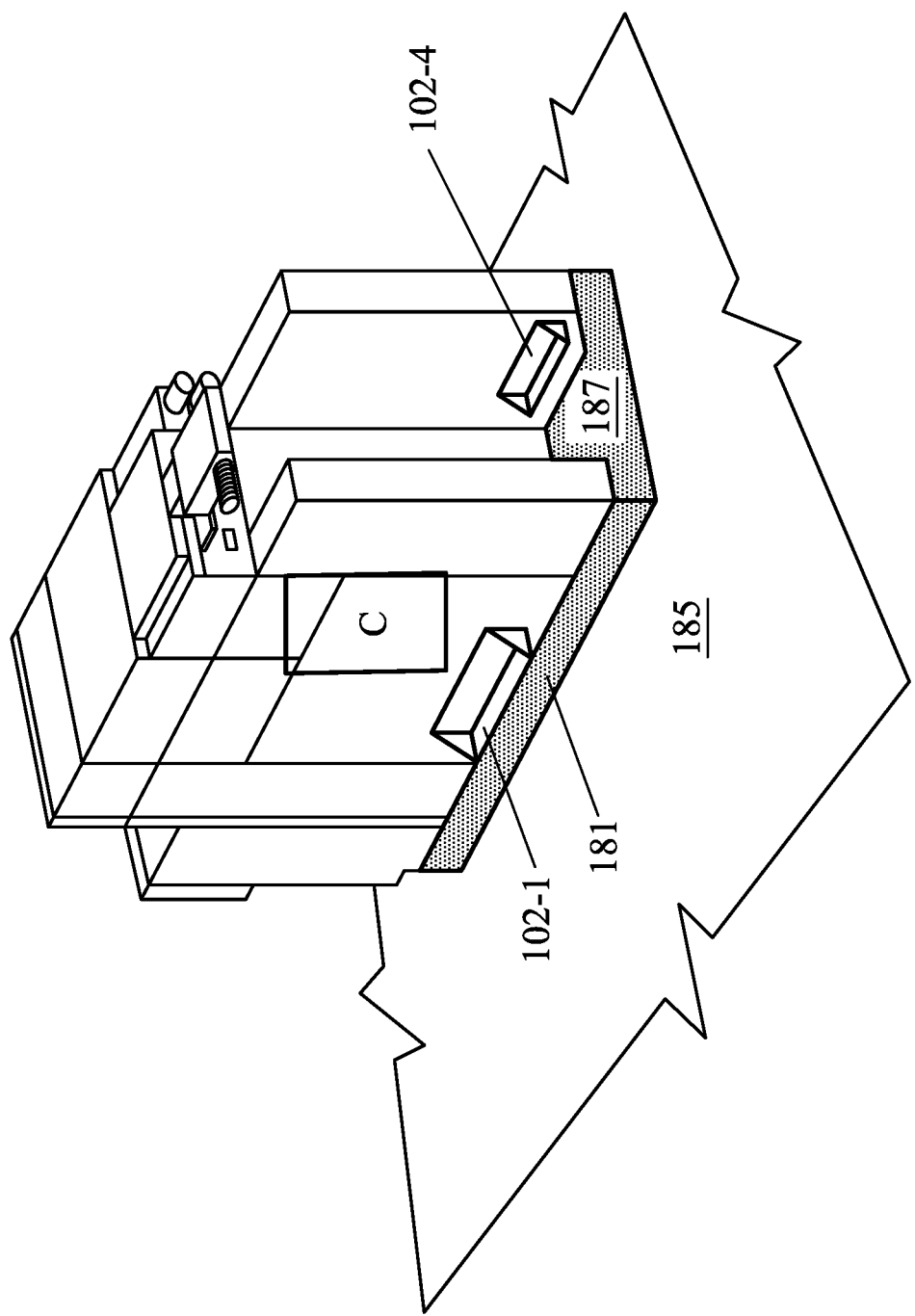
FIG. 4 illustrates the semiconductor manufacturing apparatus of FIG. 1 placed on an anti-vibration platform.

In some embodiments, the semiconductor manufacturing apparatus 100 is placed on an anti-vibration platform. The anti-vibration platform is used to alleviate large vibrations resulting from earthquakes, for example, but may increase minor vibrations of the equipment when the equipment is in operation (e.g., wafer transfer). The weights 102 can alleviate vibrations resulting from earthquakes and also reduce the minor vibrations due to operation of the semiconductor manufacturing apparatus 100. In some embodiments, the weights 102 are attached to the semiconductor manufacturing apparatus 100 between the base of the semiconductor manufacturing apparatus 100 and the upper surface of the anti-vibration platform. In an embodiment, the weights 102 are spaced from the upper surface of the anti-vibration platform and the floor. FIG. 4 illustrates the semiconductor manufacturing apparatus 100 is secured to an anti-vibration platform 181, and the weight 102 is spaced from the upper surface 187 of the anti-vibration platform 181 and the floor 185, e.g., upper surface of the floor 185 of the clean room where the semiconductor manufacturing apparatus 100 is located.

Figure 5:
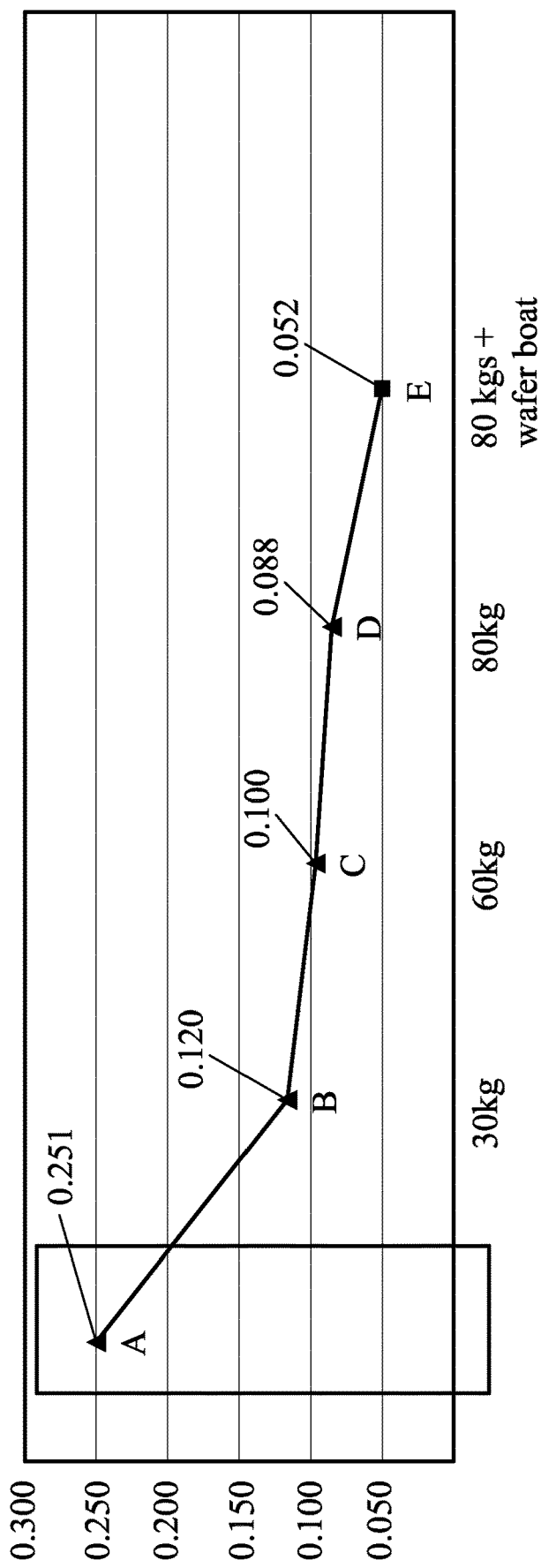
FIG. 5 is a graph that illustrates the reduction in the vibrations in a semiconductor processing equipment having weights of different values attached thereto, according to embodiments of the disclosure.

FIG. 5 is a graph that illustrates the change in the vibrations in a semiconductor processing equipment when weights of different values attached thereto, according to embodiments of the disclosure. For the sake of discussion, the semiconductor processing equipment is considered to be a thin film deposition apparatus or a furnace and the vibrations are measured when loading and/or unloading a wafer boat. The vibrations at or proximate the location where the wafer boat is loaded/unloaded are measured in the absence of weights and in the presence of weights of different weight values. At point A, no weights are attached to the thin film deposition apparatus, and, as indicated, the vibrations are the largest at around 0.25 mm/min wen loading (or unloading) the wafer boat. At points B, C, and D, increasingly heavier weights (30 kg, 60 kg, 80 kg, respectively) are attached to the semiconductor processing equipment and while the wafer boat is being loaded and/or unloaded. As indicated, the vibrations are significantly reduced to around 0.12 mm/min, 0.1 mm/min, and 0.08 mm/min, respectively. At point E, the wafer boat is loaded in the thin film deposition apparatus and weights of 80 kgs are attached to the thin film deposition apparatus. As indicated, the vibrations are the least at around 0.052 mm/min. It is thus observed that addition of weights substantially reduces the vibrations in the thin film deposition apparatus from around 0.25 mm/min to around 0.052 mm/min. The vibrations are measured (tested) using auto vibration system (AVS) or other types of vibration meters, for example.

In a method of reducing the vibrations in a semiconductor processing equipment using the weights 102, initially, the vibrations are measured in the absence of weights and when performing the desired operations using the semiconductor processing equipment. In some embodiments, the vibrations are measured at multiple locations in the semiconductor processing equipment when operating the semiconductor processing equipment. In other embodiments, the vibrations are measured at locations in the semiconductor processing equipment where processing more susceptible to vibrations occur. For instance, in the thin film deposition apparatus, the vibrations are measured at or proximate locations where the wafer boat is loaded/unloaded and while the wafer boat is being loaded/unloaded. After the vibrations have been measured, weights are attached to the semiconductor processing equipment at desired locations and the vibrations are measured again. If the vibrations are over an acceptable level, the weights are increased. Either the previously attached weights are removed and replaced with heavier weights, or additional weights are placed on the existing weights, as discussed elsewhere in this document. The vibrations are measured again to ensure the vibrations are at or below an acceptable level. If the vibrations are over an acceptable level, the weights are further increased. After the vibration level is at or below an acceptable level, operations are performed using the semiconductor processing equipment.

Embodiments of the disclosure advantageously reduce the vibrations of the equipment and the equipment may become more stable in view of reduced vibration. Because of the reduced vibration, defects and/or other manufacturing errors are reduced. It will be understood that not all advantages have been necessarily discussed herein, no particular advantage is required for all embodiments or examples, and other embodiments or examples may offer different advantages.

Figure 6:
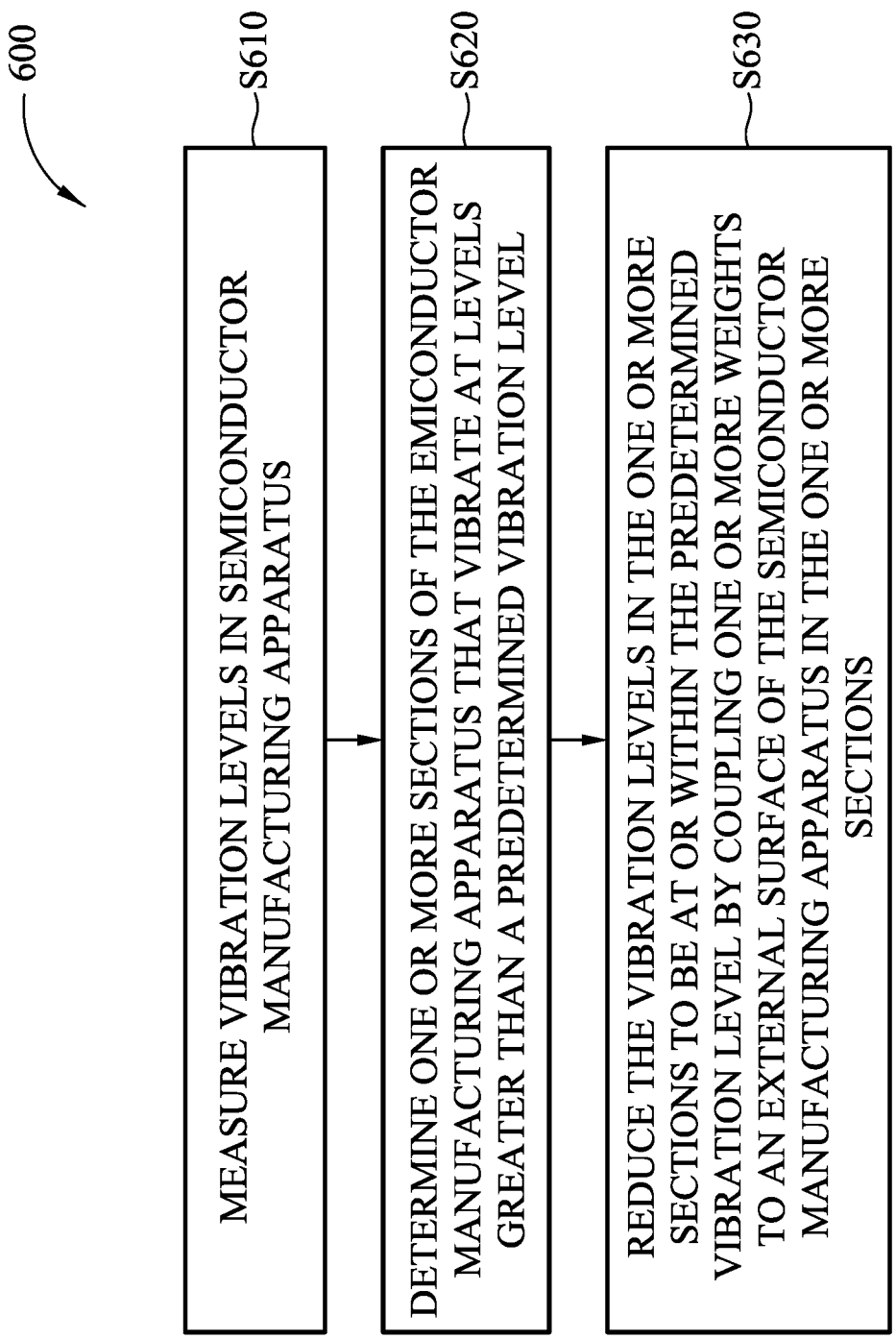
FIG. 6 is a flowchart of a method of reducing vibrations in a semiconductor manufacturing apparatus, according to embodiments of the disclosure.

An embodiment of the present disclosure is a method 600 of reducing vibrations in a semiconductor manufacturing apparatus according to the flowchart illustrated in FIG. 6. It is understood that additional operations can be provided before, during, and after processes discussed in FIG. 6, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S610 of measuring vibration levels in semiconductor manufacturing apparatus. In operation S620, one or more sections are determined of the semiconductor manufacturing apparatus that vibrate at levels greater than a predetermined vibration level. In operation S630, the vibration levels are reduced in the one or more sections to be at or within the predetermined vibration level by coupling one or more weights to an external surface of the semiconductor manufacturing apparatus in the one or more sections.

Figure 7:
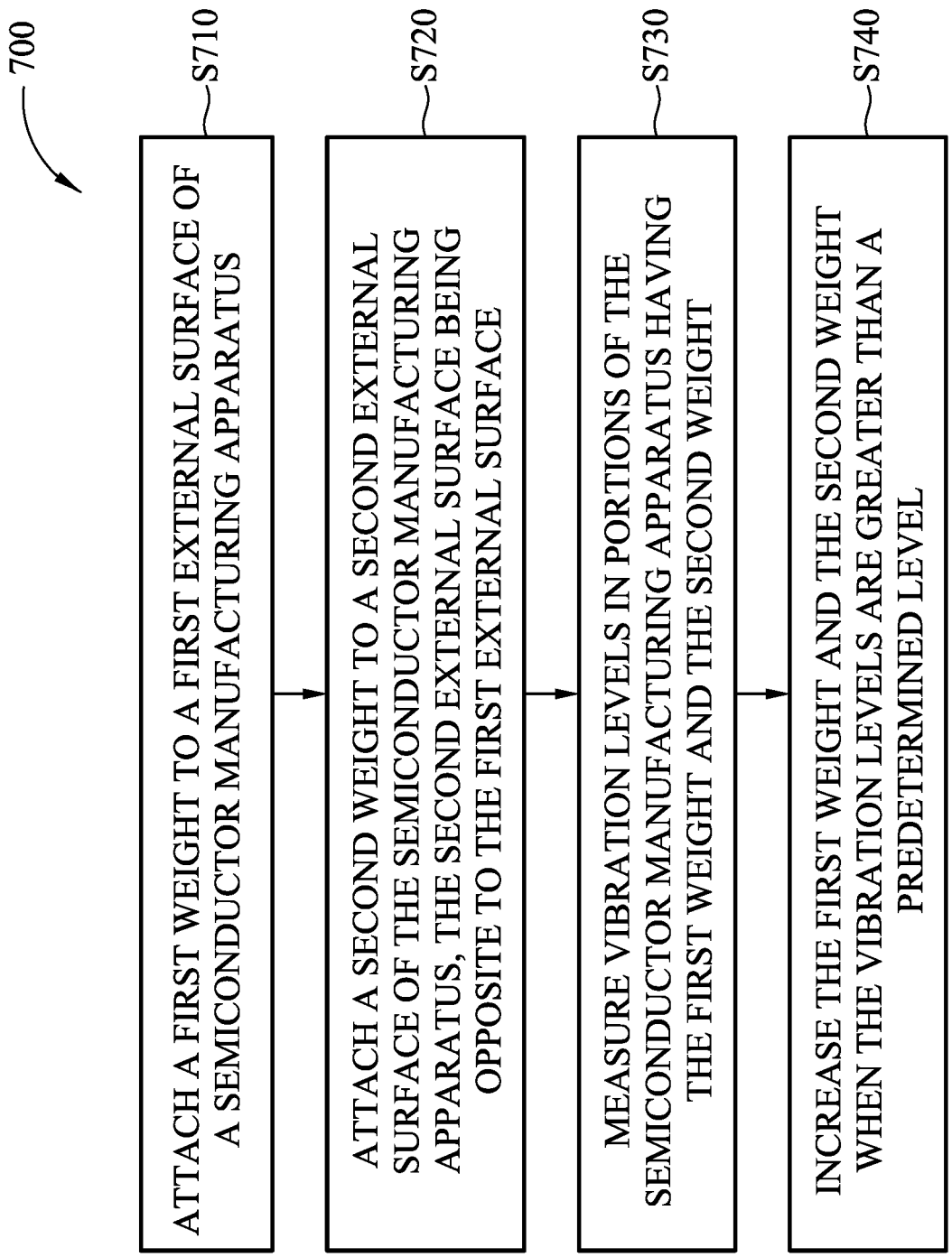
FIG. 7 is a flowchart of a method of reducing vibrations in a semiconductor manufacturing apparatus, according to embodiments of the disclosure.

An embodiment of the present disclosure is a method 700 of reducing vibrations in a semiconductor manufacturing apparatus according to the flowchart illustrated in FIG. 7. It is understood that additional operations can be provided before, during, and after processes discussed in FIG. 7, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S710 of attaching a first weight to a first external surface of a semiconductor manufacturing apparatus. In operation S720, a second weight is attached to a second external surface of the semiconductor manufacturing apparatus, the second external surface being opposite to the first external surface. In operation S730, vibration levels are measured in portions of the semiconductor manufacturing apparatus having the first weight and the second weight. In operation S740, the first weight and the second weight are increased when the vibration levels are greater than a predetermined level.

In accordance with an aspect of the present disclosure, a method of reducing vibrations includes measuring vibration levels in semiconductor manufacturing apparatus, determining one or more sections of the semiconductor manufacturing apparatus that vibrate at levels greater than a predetermined vibration level, and reducing the vibration levels in the one or more sections to be at or within the predetermined vibration level by coupling one or more weights to an external surface of the semiconductor manufacturing apparatus in the one or more sections. In some embodiments, the one or more weights are coupled spaced from a ground surface on which the semiconductor manufacturing apparatus is positioned. In some embodiments, a plurality of weights are coupled to the semiconductor manufacturing apparatus, the plurality of weights are coupled to opposite lateral walls of the semiconductor manufacturing apparatus, and each weight is coupled opposite another weight. In some embodiments, the weights coupled to the opposite lateral walls face toward each other. In some embodiments, the weights attached to the opposite lateral walls face away from each other. In some embodiments, the method further comprises increasing an overall weight amount attached to the semiconductor manufacturing apparatus by coupling additional weights to existing weights coupled to the semiconductor manufacturing apparatus. In some embodiments, a plurality of weights are coupled to the semiconductor manufacturing apparatus and each weight has a same weight value. In some embodiments, the semiconductor manufacturing apparatus is placed on an anti-vibration platform that is placed on a ground surface, and method includes coupling the one or more weights between a base of the semiconductor manufacturing apparatus and an upper surface of the anti-vibration platform. In some embodiments, the weights are spaced from the upper surface of the anti-vibration platform and the ground surface.

In accordance with another aspect of the present disclosure, a method of reducing vibrations includes attaching a first weight to a first external surface of a semiconductor manufacturing apparatus, attaching a second weight to a second external surface of the semiconductor manufacturing apparatus, the second external surface being opposite to the first external surface, measuring vibration levels in portions of the semiconductor manufacturing apparatus having the first weight and the second weight, and increasing the first weight and the second weight when the vibration levels are greater than a predetermined level. In some embodiments, the first weight is attached exactly opposite the second weight. In some embodiments, the method further comprises attaching a third weight on the first external surface and a fourth weight on the second external surface to reduce the vibration levels to be less than or equal to the predetermined level. In some embodiments, a plurality of weights are attached to the first external surface and the second external surface, the plurality of weights including the first weight and the second weight, and a same number of weights are attached to the first external surface and the second external surface. In some embodiments, each weight on the first external surface has a corresponding weight on the second external surface and attached exactly opposite to each other. In some embodiments, the first weight and the second weight are attached separated from a ground surface on which the semiconductor manufacturing apparatus is positioned. In some embodiments, increasing the first weight and the second weight includes coupling additional weights to each of the first weight and the second weight. In some embodiments, the first weight and the second weight have a same weight value.

In accordance with another aspect of the present disclosure, a semiconductor manufacturing apparatus includes a first lateral wall, a second lateral wall opposite the first lateral wall, and one or more weights attached to first lateral wall and the second lateral wall, wherein the weights are attached on locations on the semiconductor manufacturing apparatus that maximize a reduction in vibrations of the semiconductor manufacturing apparatus at those locations. In some embodiments, each weight is attached separated from a ground surface on which the semiconductor manufacturing apparatus is positioned. In some embodiments, the semiconductor manufacturing apparatus further includes one or more additional weights coupled to the one or more weights to increase an overall weight on the semiconductor manufacturing apparatus.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   measuring vibration levels in semiconductor manufacturing apparatus;
   determining one or more sections of the semiconductor manufacturing apparatus that vibrate at levels greater than a predetermined vibration level; and
   reducing the vibration levels in the one or more sections to be at or within the predetermined vibration level by coupling a plurality of weights to an external surface of the semiconductor manufacturing apparatus in the one or more sections, the plurality of weights being coupled to opposite lateral walls of the semiconductor manufacturing apparatus.

2. The method of claim 1, wherein the plurality of weights are coupled spaced from a ground surface on which the semiconductor manufacturing apparatus is positioned.

3. The method of claim 1, wherein each weight of the plurality of weights is coupled opposite another weight of the plurality of weights.

4. The method of claim 3, wherein the opposite lateral walls include external surfaces of the semiconductor manufacturing apparatus and the weights coupled to the opposite lateral walls face toward each other.

5. The method of claim 3, wherein the weights attached to the opposite lateral walls face away from each other.

6. The method of claim 1, further comprising increasing an overall weight amount attached to the semiconductor manufacturing apparatus by coupling additional weights to existing weights coupled to the semiconductor manufacturing apparatus.

7. The method of claim 1, wherein each weight of the plurality of weights has a same weight value.

8. The method of claim 1, wherein the semiconductor manufacturing apparatus is placed on an anti-vibration platform that is placed on a ground surface, and method includes coupling the plurality of weights between a base of the semiconductor manufacturing apparatus and an upper surface of the anti-vibration platform.

9. The method of claim 8, wherein the plurality of weights are spaced from the upper surface of the anti-vibration platform and the ground surface.

10. A method, comprising:
    attaching a first weight to a first external surface of a semiconductor manufacturing apparatus;
    attaching a second weight to a second external surface of the semiconductor manufacturing apparatus, the second external surface being opposite to the first external surface and the first external surface and the second external surface forming opposite lateral walls of the semiconductor manufacturing apparatus;
    measuring vibration levels in portions of the semiconductor manufacturing apparatus having the first weight and the second weight; and
    increasing the first weight and the second weight when the vibration levels are greater than a predetermined level.

11. The method of claim 10, wherein the first weight is attached exactly opposite the second weight.

12. The method of claim 10, further comprising:
    attaching a third weight on the first external surface and a fourth weight on the second external surface to reduce the vibration levels to be less than or equal to the predetermined level.

13. The method of claim 10, wherein a plurality of weights are attached to the first external surface and the second external surface, the plurality of weights including the first weight and the second weight, and
    a same number of weights are attached to the first external surface and the second external surface.

14. The method of claim 13, wherein each weight on the first external surface has a corresponding weight on the second external surface and attached exactly opposite to each other.

15. The method of claim 10, wherein the first weight and the second weight are attached separated from a ground surface on which the semiconductor manufacturing apparatus is positioned.

16. The method of claim 10, wherein increasing the first weight and the second weight comprises:
    coupling additional weights to each of the first weight and the second weight.

17. The method of claim 10, wherein the first weight and the second weight have a same weight value.

18. Semiconductor manufacturing apparatus, comprising:
    a first lateral wall;
    a second lateral wall opposite the first lateral wall, the first lateral wall and the second lateral wall forming external surfaces of the semiconductor manufacturing apparatus; and
    one or more weights each attached to the external surfaces formed by the first lateral wall and the second lateral wall, wherein the weights are attached on locations on the semiconductor manufacturing apparatus that maximize a reduction in vibrations of the semiconductor manufacturing apparatus at those locations.

19. The semiconductor manufacturing apparatus of claim 18, wherein each weight is attached separated from a ground surface on which the semiconductor manufacturing apparatus is positioned.

20. The semiconductor manufacturing apparatus of claim 18, further comprising:
    one or more additional weights coupled to the one or more weights to increase an overall weight on the semiconductor manufacturing apparatus.

* * * * *